(12) United States Patent
Kariya et al.

(10) Patent No.: US 7,994,432 B2
(45) Date of Patent: *Aug. 9, 2011

(54) HEAT RESISTANT SUBSTRATE INCORPORATED CIRCUIT WIRING BOARD

(75) Inventors: Takashi Kariya, Ibi-gun (JP); Toshiki Furutani, Ibi-gun (JP); Takeshi Kawanishi, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/488,207

(22) Filed: Jun. 19, 2009

(65) Prior Publication Data

US 2009/0255716 A1    Oct. 15, 2009

Related U.S. Application Data

(63) Continuation of application No. 12/330,147, filed on Dec. 8, 2008, which is a continuation of application No. 11/415,117, filed on May 2, 2006, now Pat. No. 7,462,784.

(51) Int. Cl.
H05K 1/16 (2006.01)
(52) U.S. Cl. .................................. 174/260; 174/262
(58) Field of Classification Search .......... 174/260–262; 361/792–795
See application file for complete search history.

(56) References Cited

U.S. PATENT DOCUMENTS

| | | | |
|---|---|---|---|
| 4,736,521 A | 4/1988 | Dohya | |
| 5,375,042 A | 12/1994 | Arima et al. | |
| 6,339,197 B1 | 1/2002 | Fushie et al. | |
| 6,507,497 B2 | 1/2003 | Mashino | |
| 6,526,654 B1 | 3/2003 | Song et al. | |
| 7,002,075 B2 * | 2/2006 | Kambe et al. | 174/565 |
| 7,091,589 B2 * | 8/2006 | Mori et al. | 257/686 |
| 7,462,784 B2 * | 12/2008 | Kariya et al. | 174/260 |
| 2002/0100608 A1 | 8/2002 | Fushie et al. | |
| 2003/0155638 A1 | 8/2003 | Ito | |
| 2004/0160751 A1 | 8/2004 | Inagaki et al. | |
| 2005/0136634 A1 | 6/2005 | Savastiouk et al. | |
| 2005/0263867 A1 | 12/2005 | Kambe et al. | |
| 2006/0000640 A1 | 1/2006 | Fushie et al. | |
| 2006/0076659 A1 | 4/2006 | Chung | |
| 2006/0180341 A1 | 8/2006 | Kariya et al. | |

(Continued)

FOREIGN PATENT DOCUMENTS

EP  1 761 119 A1  3/2007

(Continued)

OTHER PUBLICATIONS

Computer Translation of JP02004228521A.

(Continued)

*Primary Examiner* — Ishwarbhai B Patel
(74) *Attorney, Agent, or Firm* — Oblon, Spivak, McClelland, Maier & Neustadt, L.L.P.

(57) ABSTRACT

A circuit wiring board including a wiring substrate, and a heat resistant substrate accommodated in the wiring substrate and having a thermal expansion coefficient in a range between 3 ppm to 10 ppm and including a core substrate and a built-up wiring layer formed over the core substrate, the built-up wiring layer including conductive layers, interlayer resin insulating layers and a via hole conductor connecting the conductive layers through one of the interlayer resin insulating layers.

10 Claims, 17 Drawing Sheets

U.S. PATENT DOCUMENTS

2006/0191710 A1    8/2006   Fushie et al.
2006/0231290 A1   10/2006   Kariya et al.

FOREIGN PATENT DOCUMENTS

| JP | 10-284632 | 10/1998 |
| --- | --- | --- |
| JP | 11-289025 | 10/1999 |
| JP | 2001-44639 | 2/2001 |
| JP | 2001-102479 | 4/2001 |
| JP | 2001-326305 | 11/2001 |
| JP | 2002-344142 | 11/2002 |
| JP | 2003-197811 | 7/2003 |
| JP | 2003-204152 | 7/2003 |
| JP | 02004228521 A | 8/2004 |
| TW | 479335 B | 3/2002 |

OTHER PUBLICATIONS

U.S. Appl. No. 12/488,224, filed Jun. 19, 2009, Kariya, et al.

* cited by examiner

HEAT RESISTANT SUBSTRATE INCORPORATED CIRCUIT WIRING BOARD

CROSS REFERENCE OF RELATED APPLICATION

This application is a continuation of and claims the benefit of priority under 35 U.S.C. §120 from U.S. Ser. No. 12/330,147, filed Dec. 8, 2008, which is a continuation of U.S. Ser. No. 11/415,117, filed May 2, 2006, now U.S. Pat. No. 7,462,784, issued Dec. 9, 2008, the entire contents of each of which are hereby incorporated by reference.

BACKGROUND OF THE INVENTION

1. Field of the Invention

The present invention relates to a heat resistant substrate incorporated circuit wiring board incorporating a heat resistant substrate and more particularly to a heat resistant substrate incorporating circuit wiring board preferable for a package board to be loaded with an IC chip.

2. Description of the Related Art

JP 2002-344142 A has disclosed a multilayer printed wiring board in which interlayer resin insulation layer and conductive layer are placed alternately on a resin core substrate having through hole conductors while the conductive layers are connected with the via hole conductor, as a multilayer printed wiring board to be loaded with an IC chip.

JP 2001-102479 A has disclosed an interposer for connecting an IC chip and a package board electrically. An interposer main body 20 in FIG. 2 is made of silicon and the electrode of an IC chip is connected to a via conductor 27 passing through silicon while wiring layer is formed on a silicon substrate located on an opposite side to the IC.

[Prior Art 1] JP 2002-344142 A is incorporated herein by reference.

[Prior Art 2] JP 2001-102479 A is incorporated herein by reference.

SUMMARY OF THE INVENTION

An object of the present invention is to provide a heat resistant substrate incorporated circuit wiring board which can achieve fine structure. Another object of the invention is to raise the yield of electronic components by including the wiring layer of the electronic component (for example, an IC chip) in a heat resistant substrate. Still another object is to reduce the thermal expansion coefficient of the entire heat resistant substrate incorporated circuit wiring board. A further object of the invention is to provide the reliability of the wiring board, particularly the heat resistant substrate incorporated circuit wiring board. A still further object of the invention is to prevent occurrence of crack in the insulation layer and conductive layer of the incorporation wiring substrate by improving the electric connection reliability between the incorporated heat resistant substrate and the incorporation wiring substrate incorporating the heat resistant substrate or preventing separation between the both.

As a result of accumulated research for achieving the above-described objects, the inventors of the present invention has reached an idea of forming a heat resistant substrate incorporated circuit wiring board having a heat resistant substrate and an incorporation wiring substrate incorporating the heat resistant substrate, wherein the heat resistant substrate comprises: a core substrate; through hole conductors for keeping the front surface and rear surface of the core substrate conductive with each other; and a built-up wiring layer formed on the core substrate, in which interlayer resin insulation layer and conductive layer are placed alternately and respective conductive layers are connected with via hole conductor.

Because a built-up wiring layer can be formed on the Si substrate surface having an excellent flatness using a core substrate constituted of a semiconductor substrate like a silicon (Si) substrate, a conductor circuit having a finer wiring than a resin substrate having unevenness and an excellent thickness accuracy can be formed, whereby realizing fine pitches of the circuit wiring board. Further, the dispersion of wiring is decreased by forming the built-up wiring layer on a mirror-processed surface, so that the dispersion of impedance can be decreased. Further, high density and small size of the circuit wiring board can be achieved by forming the built-up wiring layer on the core substrate and the thin structure can be achieved by reducing the quantity of layers. The power source can be intensified and noise can be removed by forming passive elements such as inductor (L), capacitor (C), resistor (R), DC-DC converter (VRM) on the core substrate surface or the built-up wiring layer or in the build-up wiring layer. Further, the yield of the IC and its manufacturing cost can be improved by forming part of the additional wiring layer on the IC side on the side of the heat resistant substrate.

Connection to the connecting pad of the heat resistant substrate can be secured through plating or the like by including the heat resistant substrate in the circuit wiring board, thereby improving the reliability. Further, the quantity of connecting points by solder bumps decreases and the quantity of reflows received by the substrate decreases unlike the interposer disclosed in the JP 2001-102479 A.

Because the additional wiring layer is formed in a core substrate having a small thermal expansion coefficient, the occupation ratio of the heat resistant substrate to the heat resistant substrate incorporated circuit wiring board increases with respect to a case where no additional wiring layer is formed. As a consequence, the thermal expansion coefficient of the heat resistant substrate incorporated circuit wiring board can be decreased with respect to a case where no additional wiring layer exists (the thermal expansion coefficient of the heat resistant substrate incorporated circuit wiring board turns to be a thermal expansion coefficient between a resin substrate and an electronic component). Because the shear stress between an electronic component and the heat resistant substrate incorporated circuit wiring board or between the heat resistant substrate incorporated circuit wiring board and a mother board connected to the heat resistant substrate incorporated circuit wiring board decreases if the thermal expansion coefficient decreases, the joint member (for example, solder) which joints the electronic component with the hear resistant substrate incorporated circuit wiring board or the heat resistant substrate incorporated circuit wiring board with the mother board becomes hard to destroy. Further, because an additional wiring layer is formed on the core substrate, the pitch between the through hole conductors formed in the core substrate increases. As a consequence, a crack becomes unlikely to occur in the core substrate having a low thermal expansion coefficient. Because the thermal expansion coefficient differs between the core substrate and the through hole conductor formed in the core substrate, the core substrate is deformed by the through hole conductor in the neighborhood of the through hole conductor. As the interval of the through hole conductors decreases, the quantity of deformation of the core substrate between the through hole conductors increases. Further, the through hole conductor can be formed throughout the core substrate by providing the additional wiring layer. Thus, the thermal expansion coefficient or the Young's modulus becomes substantially equal within the core substrate and thus, the warp of the core substrate decreases, thereby preventing crack in the core substrate or peeling between the heat resistant substrate and the incorporation wiring substrate. It is preferable to form the built-up layer (surface additional wiring layer) on only the surface of the core substrate in order to dispose the through hole conductors substantially uniformly throughout the core substrate.

Further, the thickness of the circuit wiring board can be decreased (to about 0.2-0.5 mm while the thickness of the multilayer printed wiring board described in JP 2002-344142A) is about 1 mm by providing the built-up wiring layer on the core substrate (about 0.3 mm thick) of silicon or the like without using a core substrate (about 0.8 mm thick) composed of glass epoxy as disclosed in JP 2002-344142 A so that its inductance is dropped thereby raising the electric characteristic. Further, the thermal expansion coefficient of the heat resistant substrate incorporated circuit wiring board can be brought close to the thermal expansion coefficient of an IC chip by including a core substrate composed of a substrate having a low thermal expansion coefficient in the incorporation wiring substrate including the interlayer resin insulation layer thereby preventing breaking of a joint member (for example, solder) between the IC chip and heat resistant substrate or between the heat resistant substrate incorporated circuit wiring board originating from a difference in thermal contraction.

Although material constituting the core substrate of the heat resistant substrate is preferred to be Si, it does not need to be restricted to this one. For example, ceramics substrate such as pyrex glass, zirconia, aluminum nitride, silicon nitride, silicon carbide, alumina, mullite, cordierite, steatite, forsterite and the like can be mentioned.
Of these, silicon substrate is preferable in views of cost because it can be obtained most easily at a cheap price.

As the material for use in a joint portion between an electronic component such as an IC and the circuit wiring board (package board), for example, Sn/Pb, Sn/Ag, Sn, Sn/Cu, Sn/Sb, Sn/In/Ag, Sn/Bi, Sn/In, copper paste, silver paste, conductive resin and the like can be mentioned although it is not restricted to any particular one.

The through hole in the core substrate may be filled with conductive substance or its non-filled portion may be filled with insulation agent or conductive material by forming plating conductor (through hole conductor) in the inner wall of the through hole. Although the conductive material to be filled in the through hole is not restricted to any particular one, it is preferable to be filled with a single metal or two or more metals selected from copper, gold, silver, nickel and the like rather than the conductive paste. The reason is that supply of power to the IC is smoothed or the quantity of generated heat drops as the resistance is lower than conductive paste. Another reason is that stress can be absorbed by plastic deformation of metal because the through hole is completely filled with metal. If the non-filled portion of the through hole conductor is filled with resin, resin with low elasticity is preferable because stress can be absorbed.

DESCRIPTION OF THE PREFERRED EMBODIMENTS

First Embodiment

1. Resin Package Board

Figure 1:
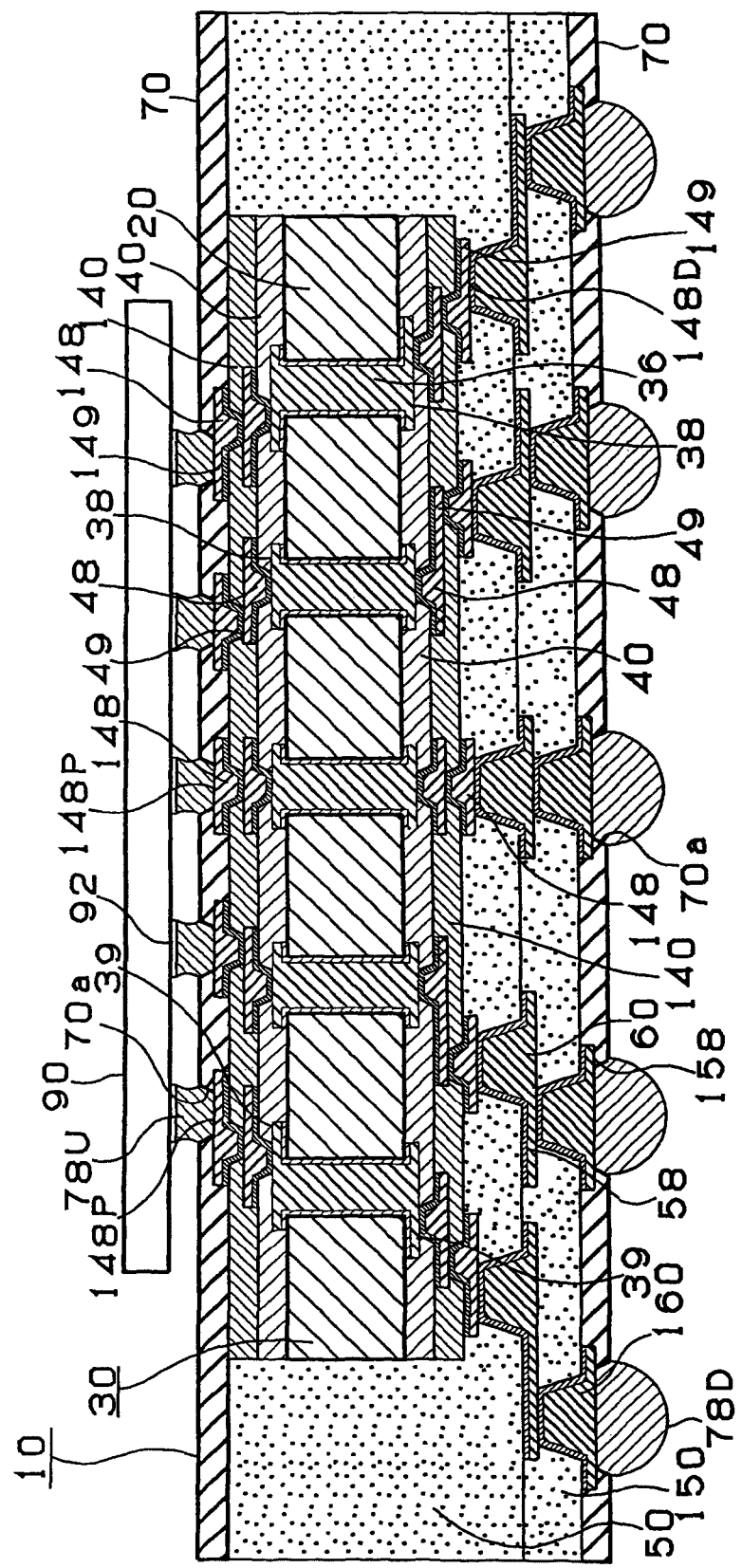
FIG. 1 is a sectional view of a heat resistant substrate incorporated circuit wiring board according to a first embodiment of the present invention.

FIG. 1 shows the structure of a heat resistant substrate incorporated circuit wiring board of the first embodiment which constitutes a resin made package board. The heat resistant substrate incorporated circuit wiring board 10 incorporates a heat resistant substrate 30. The heat resistant substrate 30 includes a base material (core substrate) 20. The base material 20 contains through hole conductors 36 and through hole pads 38 are formed on both ends of the through hole conductor 36. Conductor circuits 39 are formed on both faces of the core substrate 20. Via hole conductors 48, conductor circuits 49 and insulator layers 40 and additional wiring layer (built-up wiring layer) comprised of via hole conductors 148, conductor circuits 149 and insulation layers 140 are disposed on both faces of the base material 20. Solder resist layer 70 is formed on the front and rear faces of the heat resistant substrate incorporated circuit wiring board 10 and openings 70a are formed in the solder resist layer 70 so as to expose part of the via hole conductor 148 and the conductor circuit 149. The exposed portions of the via hole conductor 148 and the conductor circuit 149 correspond to loading pads 148P. Solder bumps 78U are provided on the loading pads 148P. An IC chip 90 is loaded by connecting electrodes 92 of the IC chip 90 through the solder bumps 78U.

On the other hand, interlayer resin insulation layer 50 including via hole conductors 60 and conductor circuit 58 and interlayer resin insulation layer 150 including via hole conductors 160 and conductor circuits 158 are disposed on face (bottom face) on the opposite side to the IC chip of the heat resistant substrate 30. Solder resist layer 70 is formed on the top layer of the interlayer resin insulation layer 150 and solder bumps 78D are formed in the via hole conductors 160 through the openings 70a in the solder resist layer 70.

The loading pads 148P are formed just over the via hole conductors 148 and the conductor circuits 149 (other place than just over the via hole conductor 148) extending from the via hole conductors 148. The loading pads 148P are disposed in a grid form or a zigzag form and the pitch between the loading pads 148P can be set to 30-150 μm. This pitch is preferred to be 50-100 μm if considering the insulation property between the loading pads 148P, the reliability of the heat resistant substrate 30 and inclusion of the wiring board of an electronic component into a printed wiring board. The pitch of the loading pads 148P in the loading portion is expanded by the built-up layer and this loading pad 148P is conductive with the through hole conductor 36 through conductor circuit (see the conductor circuit 38 on the through hole conductor 36 in FIG. 1, including the conductor circuit closing the through hole conductor 36) on the core substrate 20. Here, the pitch between one through hole conductor 36 and another is larger than the pitch of the loading pads 148P and may be set to 30-200 μm. This is preferred to be 75-150 μm in views of the insulation reliability of the core substrate 20, heat resistance cycle property and crack resistance property. The built-up layer (additional wiring layer on the rear face) is formed on the rear face of the core substrate 20 also and a connecting pad 148D for securing an electric contact with an incorporation wiring substrate incorporating the heat resistant substrate 30 is formed on the rearmost face. The pitch of the connecting pads 148D is larger than the pitch of the through hole conductors 36 and may be set to 50-250 μm. The connecting pad 148D is formed just over the via hole conductor 148 or on the conductor circuit 149 extending form the via hole conductor 148. The via hole conductor 60 for the incorporation wiring substrate is formed on the connecting pad 148D.

In FIG. 1, it is permissible to adopt the through hole pads 38 or the conductor circuits 39 on the surface of the base material 20 instead of the loading pads 148P without forming any surface additional wiring layer. In this case, all the loading pads 148P may be adopted as the through hole pads 38 just over the through hole 36 or the loading pads 148P located in the circumference may be part (see the conductor circuit 39 connected to the through hole conductors 36 on both ends of FIG. 1) of the conductor circuit 39 connected to the through hole conductor 36 while the loading pad 148P located in the center may be part of the through hole pad 38 just over the through hole conductor 36.

In FIG. 1, the conductor circuit 39 and the through hole pad 38 on the rear face of the base material 20 may be adopted as the connecting pad 148D without forming the rear face additional wiring layer. In this case, all the connecting pads 148D may be adopted as the through hole pads 38 just over the through hole conductors 36. The connecting pads 148D around the core substrate 20 may be adopted as part of the conductor circuit 39 connected to the through hole conductor 36 (see the conductor circuit 39 connected to the through hole conductors 36 on both ends of FIG. 1) while the connecting pad 148D in the center may be adopted as part of the through hole pad 38 just over the through hole conductor 36. From viewpoints that the pitch of the through hole conductors 36 to be formed in the core substrate 20 can be expanded and that the insulation property, crack resistance property, heat resistance cycle property and the like of the heat resistant substrate 30 are improved, the heat resistant substrate 30 is preferred to be comprised of the substrate 20 and surface additional wiring layer (surface built-up layer).

2. Production of Heat Resistant Substrate

Manufacturing process of the heat resistant substrate of the first embodiment will be described with reference to FIGS. 2-4.

Figure 2A:
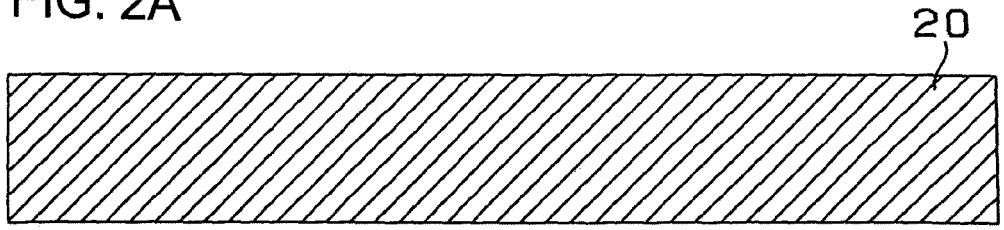
FIG. 2 is a production process diagram of a heat resistant substrate of the first embodiment.
Figure 2B:
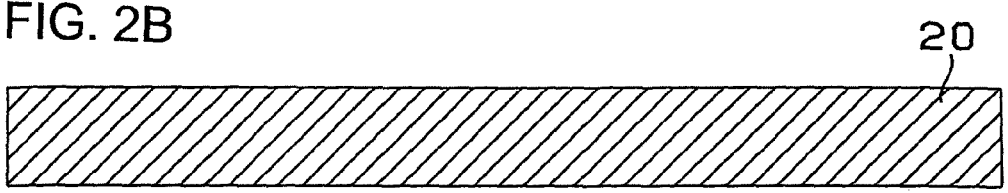

(1) A base material (core substrate) 20 of 0.5 mm in thickness composed of silicon is prepared (FIG. 2(A)). The thickness is adjusted to 0.3 mm by grinding the base material 20 (FIG. 2(B)).

Figure 2C:
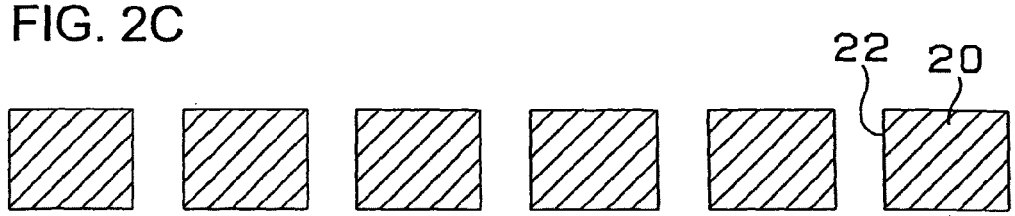
Figure 2D:
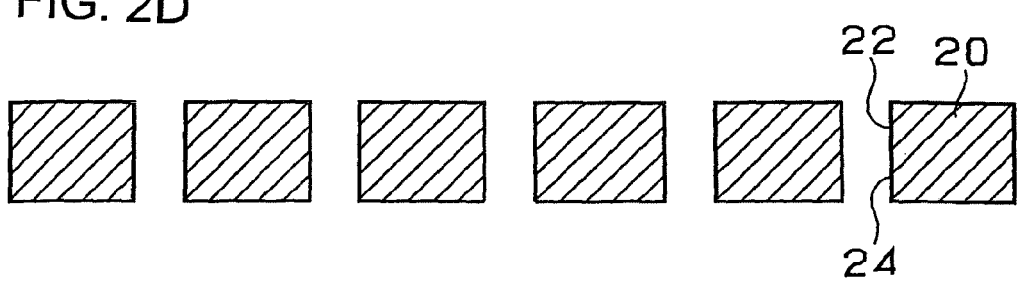

(2) Drill a through hole conductor formation opening 22 which passes through the base material 20 by irradiating with UV laser (FIG. 2(C)). The opening can be formed by sand blast or RIE although UV laser is used here.

(3) Insulation film 24 is formed by thermal oxidation at 1000° C. (FIG. 2(D)). CVD may be used instead of thermal oxidation.

Figure 2E:
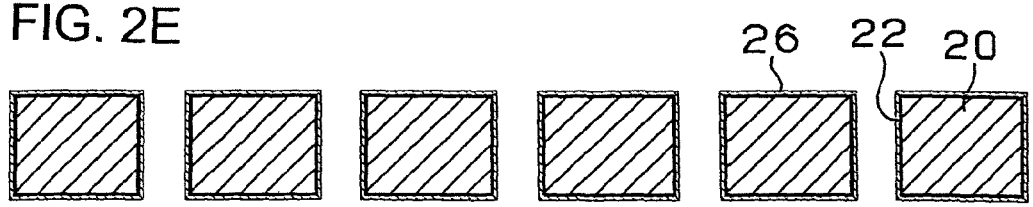

(4) Ni/Cu thin film 26 is formed by sputtering (FIG. 2(E)). Electroless plating may be used instead of sputtering.

Figure 3A:
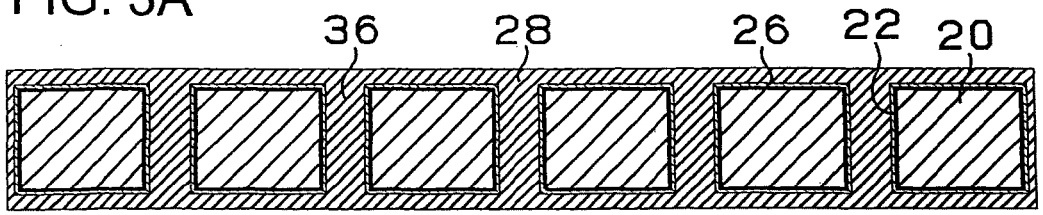
FIG. 3 is a production process diagram of a heat resistant substrate of the first embodiment.

(5) Electrolytic copper plating 28 is formed by executing electrolytic copper plating processing with plating solution below under a following condition with the thin film 26 used as plating lead wire so as to produce the electrolytic copper plating 28 in the opening 22 as the through hole conductor 36 and further, electrolytic copper plating 28 is formed on the surface of the base material 20 also (FIG. 3(A)).

[Electrolytic Plating Solution]
sulfuric acid 2.24 mol/l
copper sulfate 0.26 mol/l
additive agent 19.5 ml/l (Copper acid GL manufactured by ATOTECH JAPAN,)
[Electrolytic Plating Condition]
Current density 6.5 A/dm2
time 30 minutes
temperature 22±2° C.

Figure 3B:
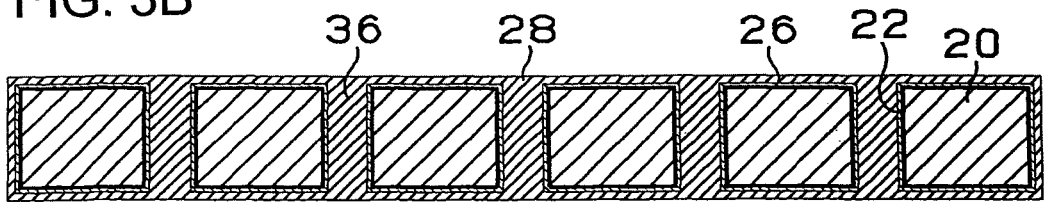

(6) The electrolytic copper plating 28 formed on the surface of the base material 20 is subjected to CMP grinding (FIG. 3(B)).

Figure 3C:
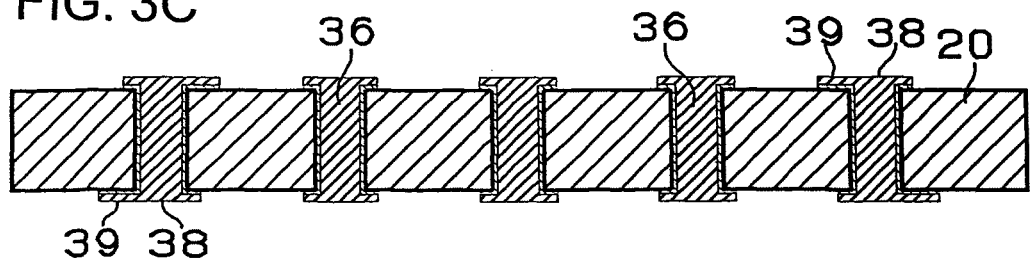

(7) The electrolytic copper plating 28 is subjected to patterning so as to form the through hole pad 38 and conductor circuit 39 (FIG. 3(C)).

Figure 3D:
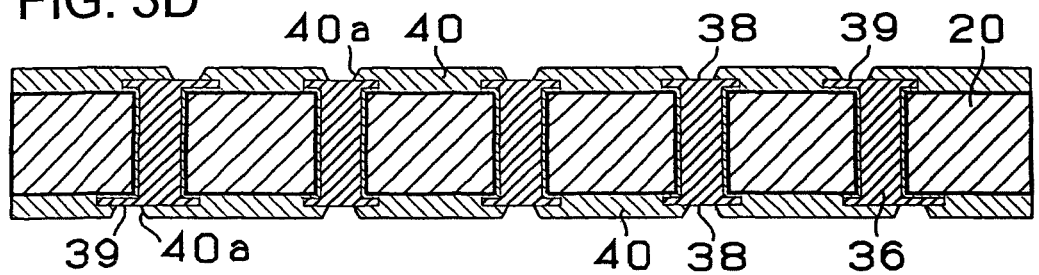

(8) Insulation layer (for example, polyimide or ABF produced by AJINOMOTO Co., Ltd.) 40 is provided on both faces of the base material 20 and an opening 40a is made with laser (FIG. 3(D)).

Figure 3E:
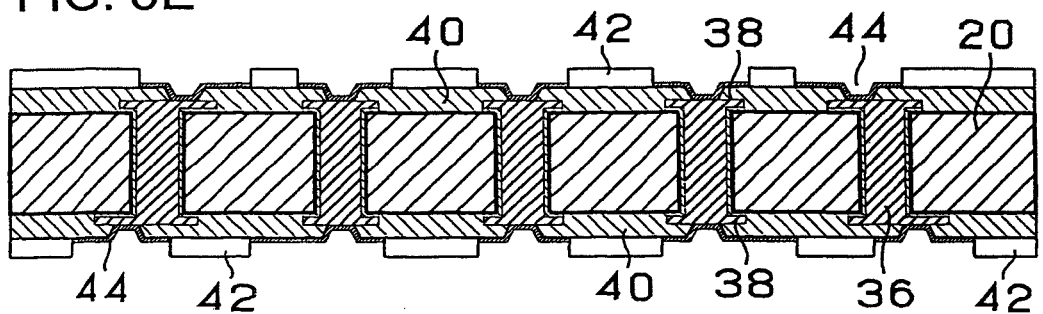

(9) Ni/Cu thin film 44 is formed on the surface of the insulation layer 40 by sputtering and plating resist 42 of a predetermined pattern is provided on the thin film (FIG. 3(E)). Electroless plating may be used instead of sputtering.

Figure 4A:
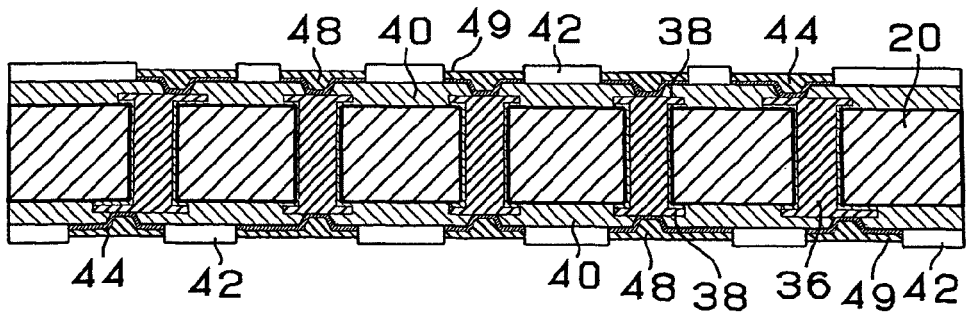
FIG. 4 is a production process diagram of a heat resistant substrate of the first embodiment.
Figure 4B:
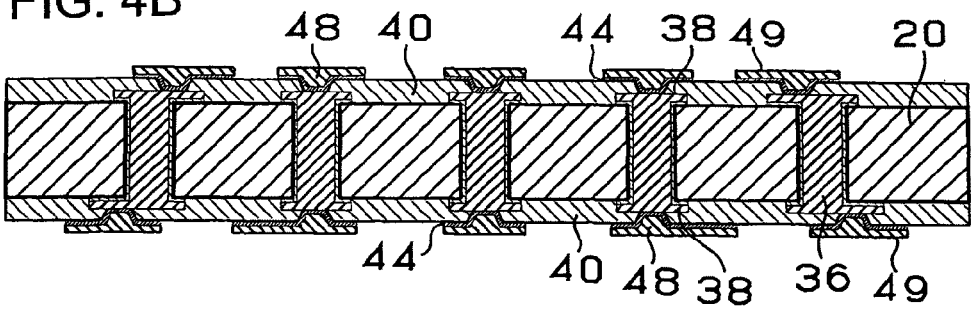

(10) The via hole conductor 48 and the conductor circuit 49 are formed by forming the electrolytic copper plating 44 (FIG. 4(A)). After that, the plating resist 42 is peeled and the thin film 44 under the resist is removed by light etching (FIG. 4(B)).

Figure 4C:
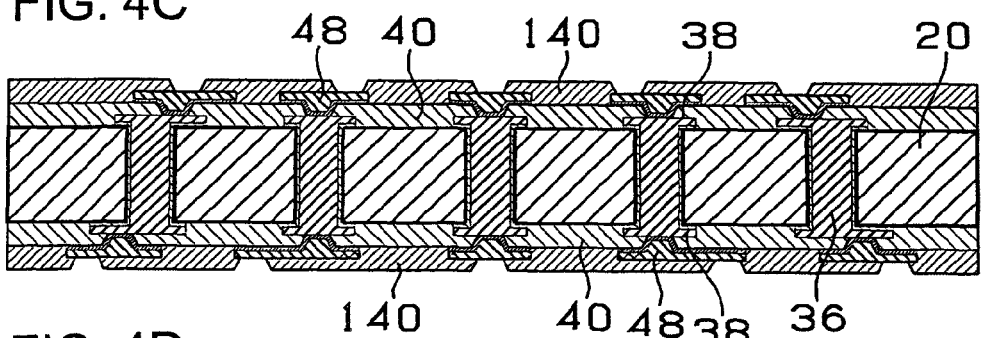
Figure 4D:
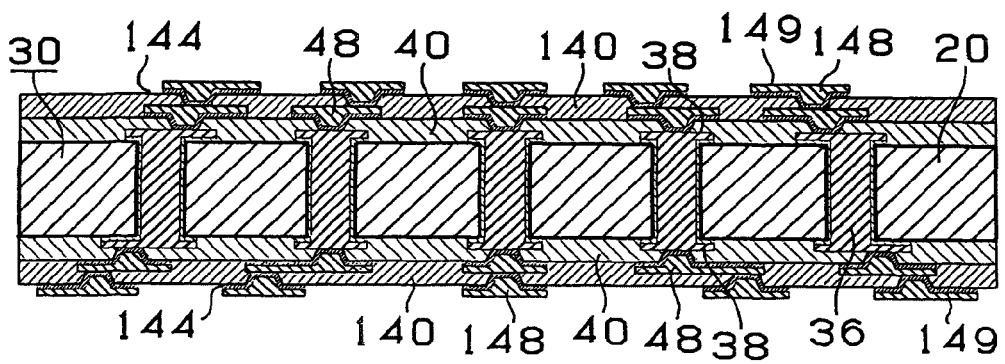

Further, the insulation layer 140 is formed (FIG. 4(C)) and the heat resistant substrate 30 is formed by providing the via hole conductor 148 and the conductor circuit 149 (FIG. 4(D)).

Hereinafter, the manufacturing process of the heat resistant substrate incorporated circuit wiring board will be described with reference to FIGS. 5-7.

Figure 5A:
FIG. 5 is a production process diagram of the heat resistant substrate incorporated circuit wiring board of the first embodiment.
Figure 5B:
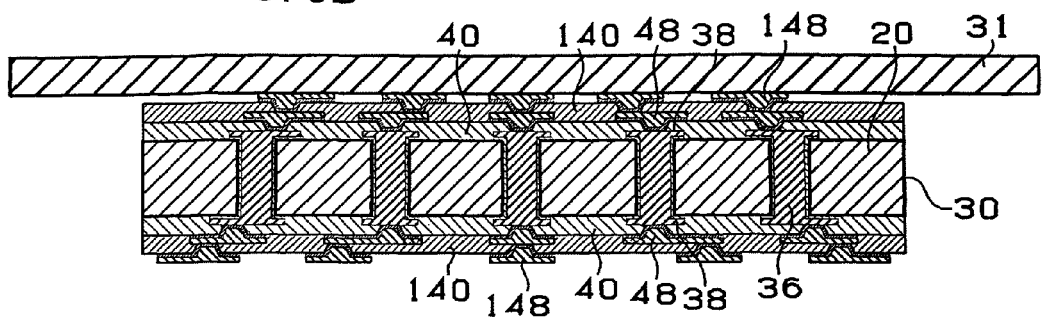
Figure 5C:
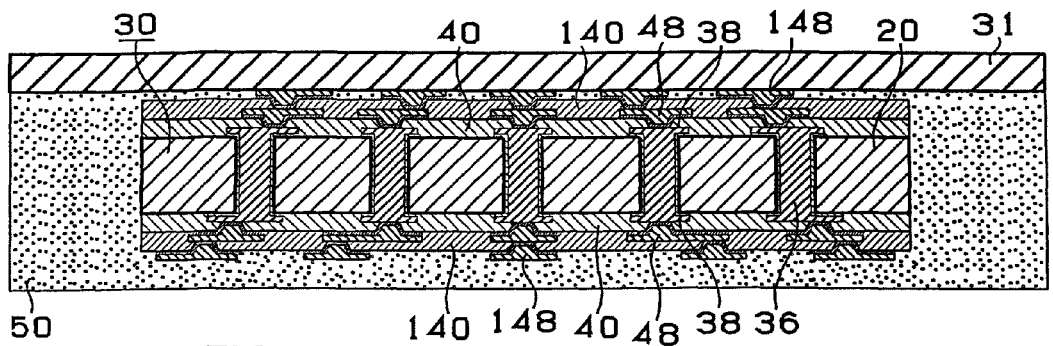

(1) A support plate 31 for supporting the heat resistant substrate is prepared (FIG. 5(A)) and the aforementioned heat resistant substrate 30 is mounted on the supporting plate 31 (FIG. 5(B)).

(2) One or a plurality of interlayer resin insulation layer resin films (manufactured by AJINOMOTO CO., Ltd.: product name; ABF-45SH) are attached to the bottom face of the supporting plate 31 and fixed with pressure temporarily under a condition of 0.45 MPa in pressure, 80° C. in temperature and 10 seconds in fitting time. Then, interlayer resin insulation layer 50 incorporating the heat resistant substrate 30 is formed by attaching it with a vacuum laminator unit according to a following method (FIG. 5(C)). That is, the interlayer resin insulation resin film is fitted to the substrate under a condition of 67 Pa in degree of vacuum, 0.47 MPa in pressure, 85° C. in temperature and 60 seconds in fitting time and after that, it is thermally cured at 170° C. for 40 minutes.

Figure 5D:
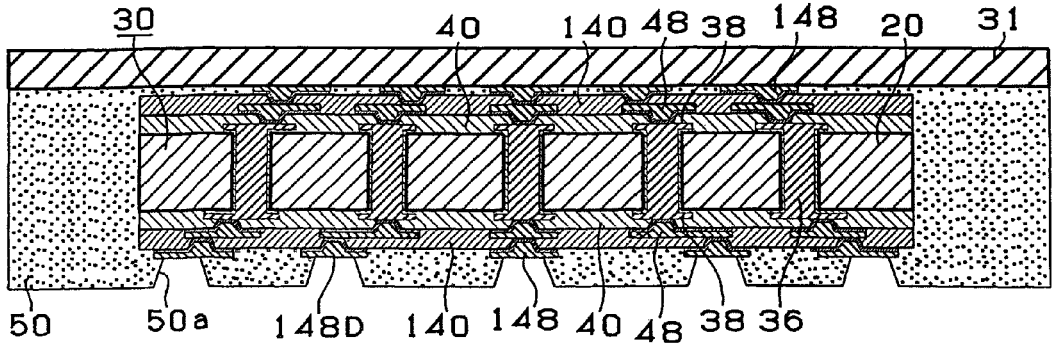

(3) Next, a via hole opening 50a is drilled in the interlayer resin insulation layer 50 under a condition of one-three shots at the diameter of the through hole in a mask of 1.0-5.0 mm, with $CO_2$ gas laser having the wavelength of 10.4 μm with a beam diameter of 4.0 mm in top-hat mode at a pulse width of 3-30μ seconds (FIG. 5(D)). After that, this board is dipped in a solution at 80° C. containing permanganic acid of 60 g/l for 10 minutes so as to remove particles existing on the surface of the interlayer resin insulation film and roughen the surface of the interlayer resin insulation layer 50 containing the inner wall of the filled via opening 50a (not shown). A portion exposed from the opening 50a turns to be the connecting pad 148D.

(4) Next, after the above-described treatment, the substrate is dipped in neutralizing solution (manufactured by Shipley Company LLC.) and washed with water. Further, catalyzed fusion is attached to the surface of the interlayer resin insulation layer and the inner wall face of the filled via hole opening by applying palladium catalyst to the surface of the substrate subjected to roughening treatment (roughening depth of 3 μm). That is, the substrate is dipped into catalyst solution containing palladium chloride ($PbCl_2$) and stannous chloride ($SnCl_2$) and supplied with catalyst by depositing palladium metal.

Figure 6A:
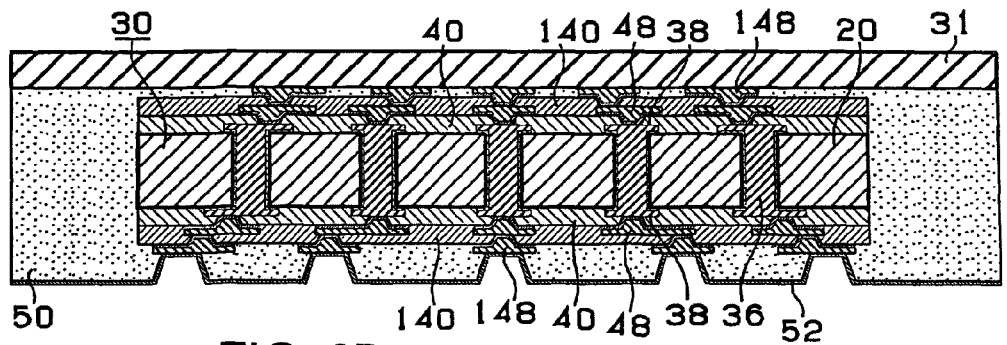
FIG. 6 is a production process diagram of the heat resistant substrate incorporated circuit wiring board of the first embodiment.

(5) Next, the substrate supplied with catalyst is dipped in electroless copper plating solution (THRU-CUP PEA) manufactured by UEMURA KOGYO so as to form electroless copper plating film 0.3-3.0 μm in thickness on the entire roughened surface and then, a substrate in which the electroless copper plating film 52 is formed on the surface of the interlayer resin insulation layer 50 containing the inner wall of the via hole opening 50a is obtained (FIG. 6(A)).

Figure 6B:
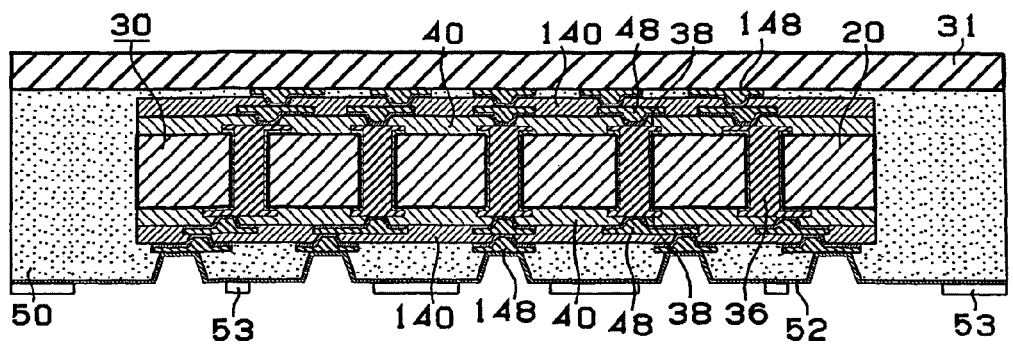
Figure 6C:
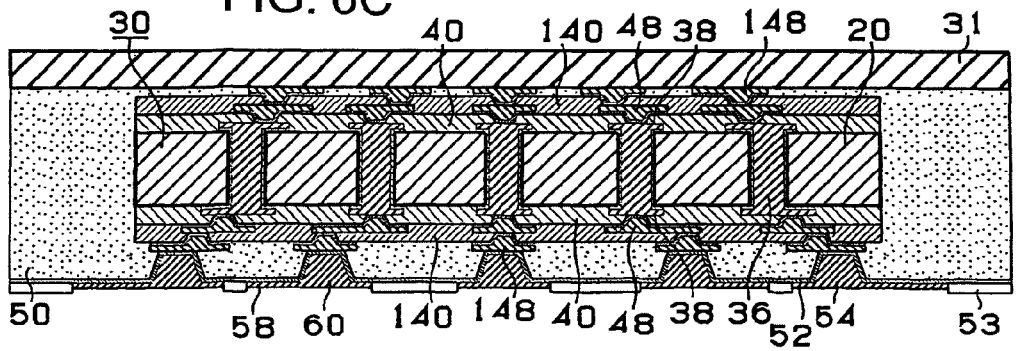

[Electroless Plating Condition]
45 minutes at 340 in terms of solution temperature (6) A marketed photosensitive dry film is attached to the substrate in which the electroless copper plating film 52 is formed and it is exposed under 110 mJ/cm2 with a mask placed over and then, plating resist 53 of 25 μm in thickness is provided by development treatment with 0.8% sodium carbonate aqueous solution (FIG. 6(B)).

(7) Then, the substrate 30 is washed with water at 50° C. and degreased. After washed with water at 25° C. and washed with sulfuric acid, electrolytic plating is carried out under a following condition to form the electrolytic plating film 54 (FIG. 6(C)).

[Electrolytic Plating Solution]
sulfuric acid 2.24 mol/l
copper sulfate 0.26 mol/l
additive agent 19.5 ml/l
leveling agent 50 mg/l
brightening agent 50 mg/l
[Electrolytic Plating Condition]
current density 1 A/dm$^2$
time 70 minutes
temperature 22±2° C.

Figure 6D:
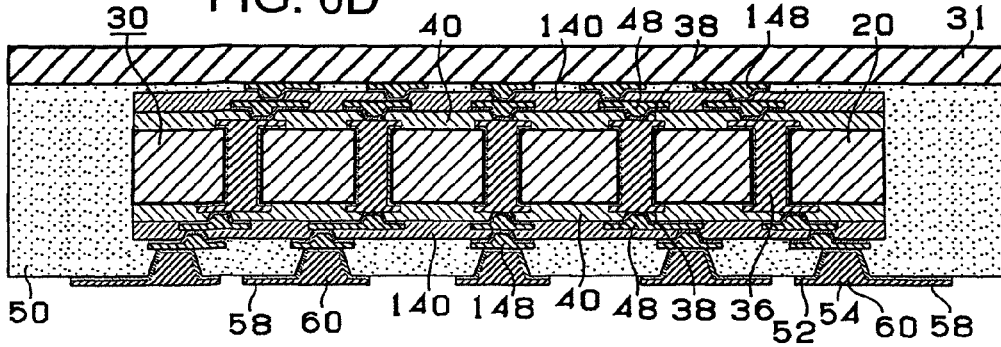

(8) The plating resist 53 is peeled and removed with 5% KOH and the electroless plating film under that plating resist is dissolved and removed by etching treatment with a mixture solution of sulfuric acid and hydrogen peroxide so as to form the independent conductor circuit 58 and via hole conductor 60 (FIG. 6(D)). Subsequently, a roughened face is formed on the surface of the conductor circuit 58 and the via hole conductor 60 (not shown).

Figure 7A:
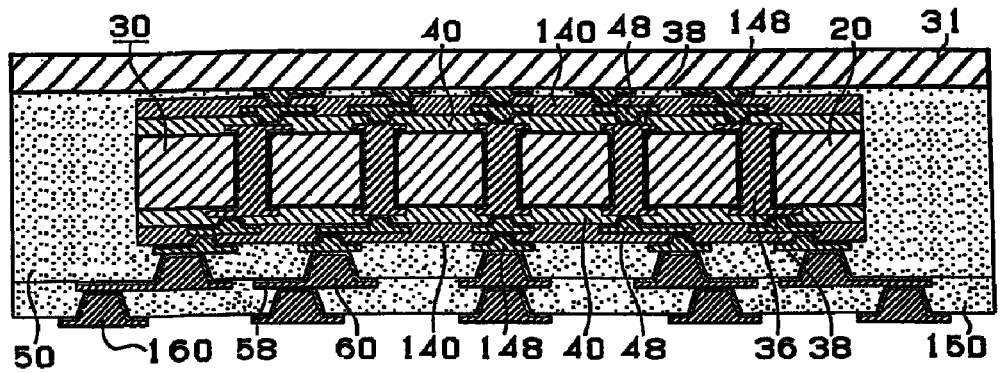
FIG. 7 is a production process diagram of the heat resistant substrate incorporated circuit wiring board of the first embodiment.
Figure 7B:
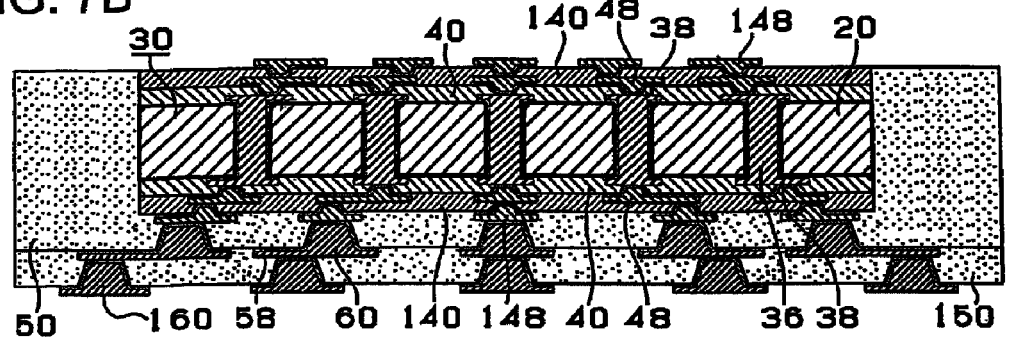
Figure 7C:
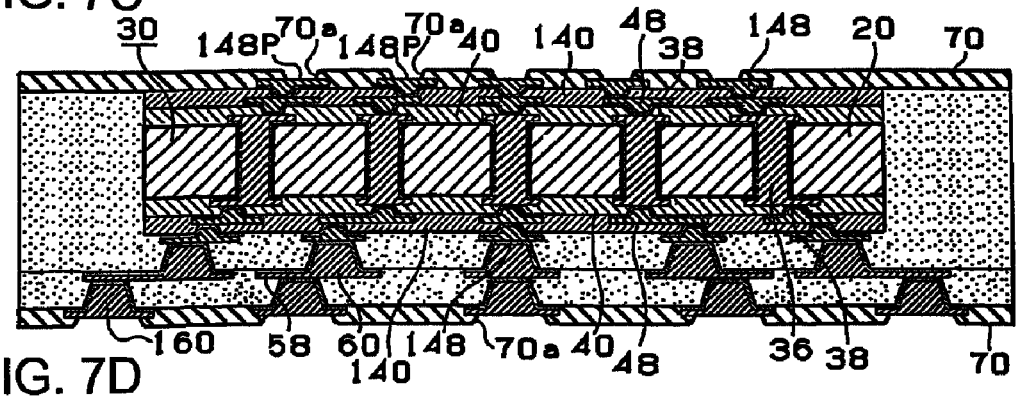

(9) The interlayer insulation layer 150 having the via hole conductor 160 in its further upper layer is formed by repeating the aforementioned processes (2)-(8) (FIG. 7(A)) and the multilayer wiring board is obtained by removing the supporting plate 31 (FIG. 7(B)).

(10) Next, the marketed solder resist compound 70 is applied to both faces of the multilayer wiring board in the thickness of 20 μm and dried under a condition at 80° C. for 20 minutes and 70° C. for 30 minutes. A photo mask of 5 mm in thickness in which the pattern of the solder resist opening portion is drawn is fitted to the solder resist layer 70 and exposed to ultraviolet ray of 1000 mJ/cm2 and then, the openings 70a of 200μ in diameter were formed by development treatment with DMTG solution (FIG. 7(C)).

Then, the solder resist layer is cured by heat treatment under a condition at 80° for an hour, 100° C. for an hour, 120° for an hour and 150° for three hours so as to form the solder resist pattern layer 70 having the openings 70a and the thickness of 15-25 μm. The via hole conductor 148 and the conductor circuit 149 exposed from the openings 70a turn to be the loading pads 148P.

(11) Next, the substrate including the solder resist layer 70 is dipped in electroless nickel plating solution of pH=4.5 containing nickel chloride (2.3×10−1 mol/l), sodium hypophosphite (2.8×10−1 mol/l) and sodium citrate (1.6×10−1 mol/l) for 20 minutes so as to form nickel plating layer (not shown) of 5 μm in thickness on the loading pad 148P of the opening portion 70a. Further, that substrate is dipped in electroless gold plating solution containing gold potassium cyanide (7.6×10−3 mol/l), ammonium chloride (1.9×10−1 mol/l), sodium citrate (1.2×10−1 mol/l), sodium hypophosphite (1.7×10−1 mol/l) at 80° C. for 7.5 minutes so as to form gold plating layer (not shown) of 0.03 μm in thickness on the nickel plating layer. A single layer of tin or precious metal (gold, silver, palladium, platinum) may be formed as well as nickel-gold layer.

Figure 7D:
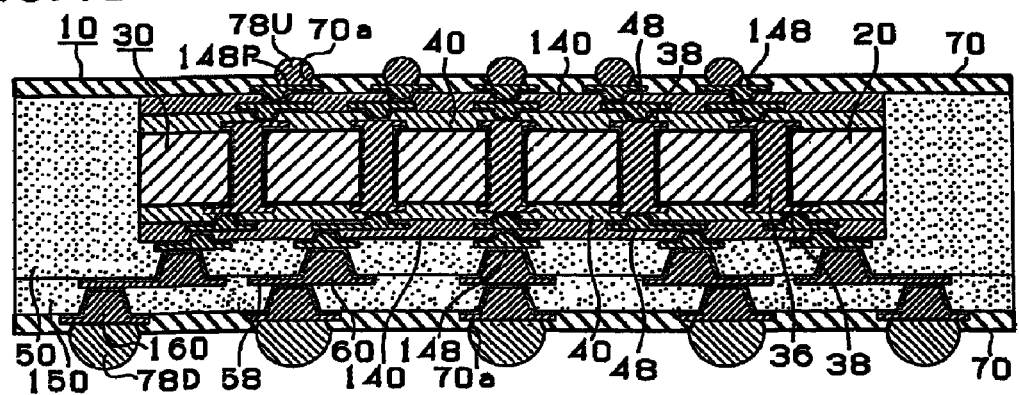

(12) After that, solder paste containing tin-lead is printed on the opening 70a in the solder resist layer 70 on a face loaded with an IC chip of the substrate, solder paste containing tin-antimony is printed on the opening 70a in the solder resist layer 70 on the other face, and solder bumps (solder bodies) are formed by reflowing at 200-240° C. so as to obtain a heat resistant substrate incorporated circuit wiring board having the solder bumps 78U and 78D (FIG. 7(D)).

3. Production of Semiconductor Device

Installation of the IC chip to the heat resistant substrate incorporated circuit wiring board (package board) 10 shown in FIG. 7(D) will be described.

First, the IC chip 90 is loaded by alignment with the heat resistant substrate incorporated circuit wiring board 10. After that, it is installed by reflowing (see FIG. 1). Then, sealant (under-fill: not shown) is applied between the heat resistant substrate incorporated circuit wiring board 10 and the IC chip 90 and cured at 80° for 15 minutes and at 150° C. for two hours.

Second Embodiment

Figure 8:
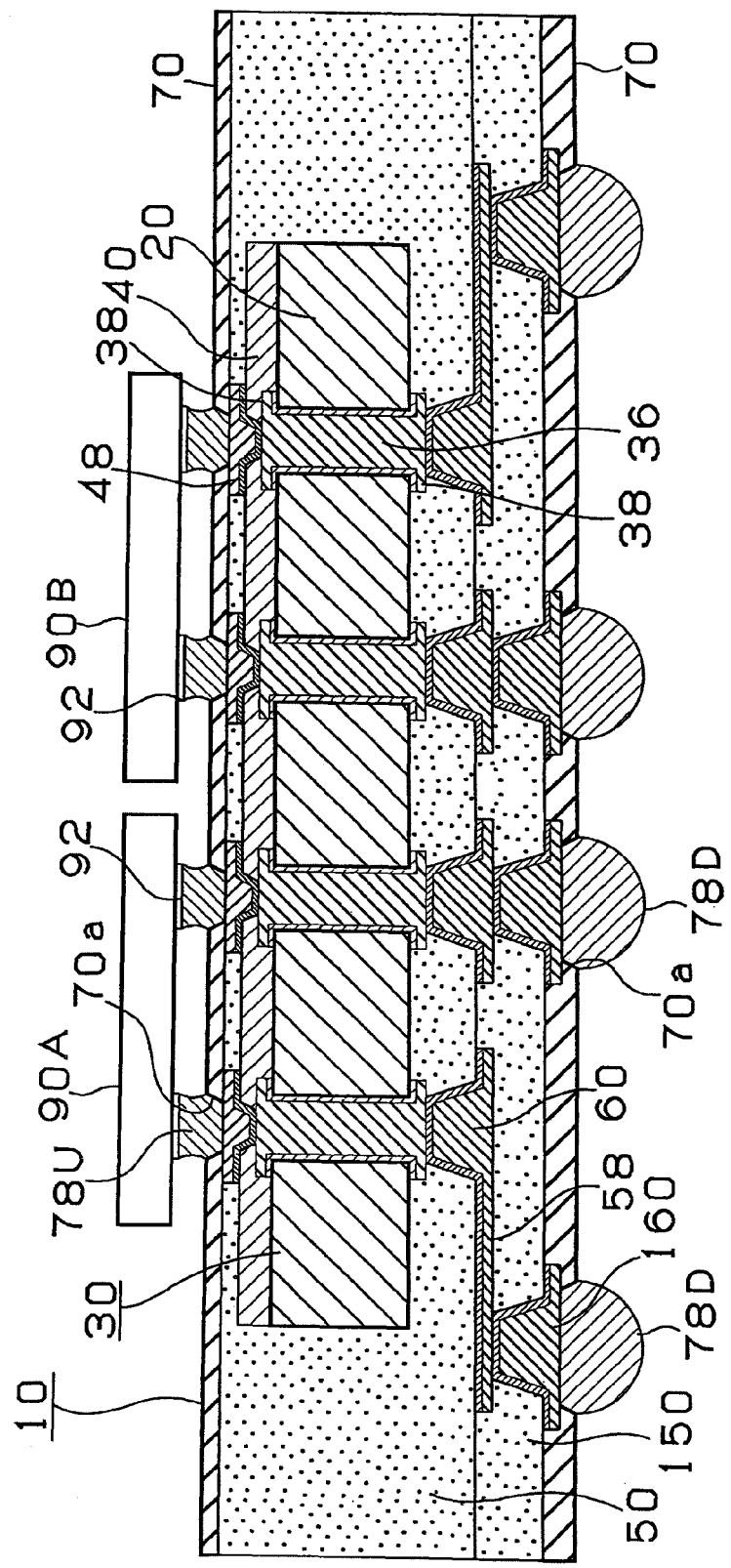
FIG. 8 is a sectional view of the heat resistant substrate incorporated circuit wiring board according to a second embodiment of the present invention.

FIG. 8 shows the structure of the heat resistant substrate incorporated circuit wiring board of the second embodiment. The heat resistant substrate incorporated circuit wiring board 10 incorporates the heat resistant substrate 30. The heat resistant substrate 30 has the base material 20, the base material 20 is provided with the through hole conductor 36 and the through hole pads 38 are formed on both ends of the through hole conductor 36. A built-up wiring layer comprised of the via hole conductor 48 and the insulation layer 40 is disposed on the face (top face) on the side of an IC chip of the heat resistant substrate 30. No additional wiring layer is provided on the rear face. The solder bump 78U is provided in the opening 70a of the solder resist layer 70 of the via hole conductor 48. An IC chip (MPU) 90A and an IC chip (memory) 90B are loaded by connecting the electrode 92 of the IC chip 90A and IC chip 90B.

The thickness of the heat resistant substrate incorporated circuit wiring board 10 is 0.1-1.0 mm and the thickness of the core substrate 20 is 0.05-0.5 mm.

The thermal expansion coefficient of the base material (core base plate) 20 is 3.0-10 ppm and the thermal expansion coefficient of the heat resistant substrate incorporated circuit wiring board 10 can be reduced by means of the base material 20. Stress caused by a difference in thermal expansion between the IC chips 90A, 90B and the resin made heat resistant substrate incorporated circuit wiring board 10 is reduced. As a result, stress applied to the solder bump between the IC chip and resin made package is reduced. Further, no stress is transmitted to the resin of the wiring layer of the IC chip wiring board. Thus, no crack or breaking occurs in the resin of the IC chip wiring layer.

Third Embodiment

Figure 9:
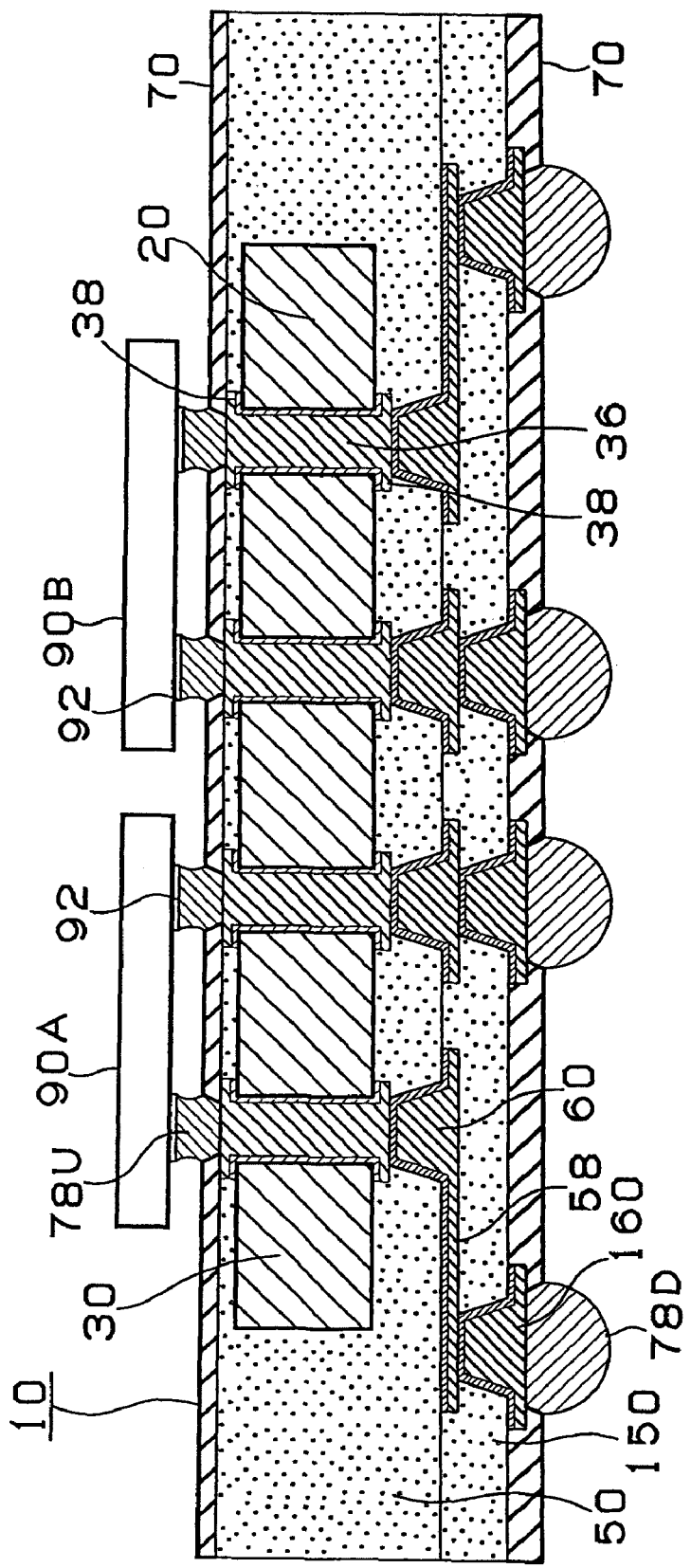
FIG. 9 is a sectional view of the heat resistant substrate incorporated circuit wiring board according to a third embodiment of the present invention.

The structure of the heat resistant substrate incorporated circuit wiring board of the third embodiment will be described with reference to FIG. 9. The additional wiring layers are provided on both faces of the core substrate in the first embodiment described with reference to FIG. 1. Contrary to this, according to the third embodiment, no additional wiring is provided on its core substrate. The structure of the third embodiment also enables the heat resistant substrate incorporated circuit wiring board to be thinned with the core substrate 20 and prevents breaking of wire caused by thermal contraction by bringing the thermal expansion coefficients of the IC chip (chip set) 90A and IC chip (GPLI) 90B and the heat resistant substrate incorporated circuit wiring board 30 close to each other.

Fourth Embodiment

Figure 10:
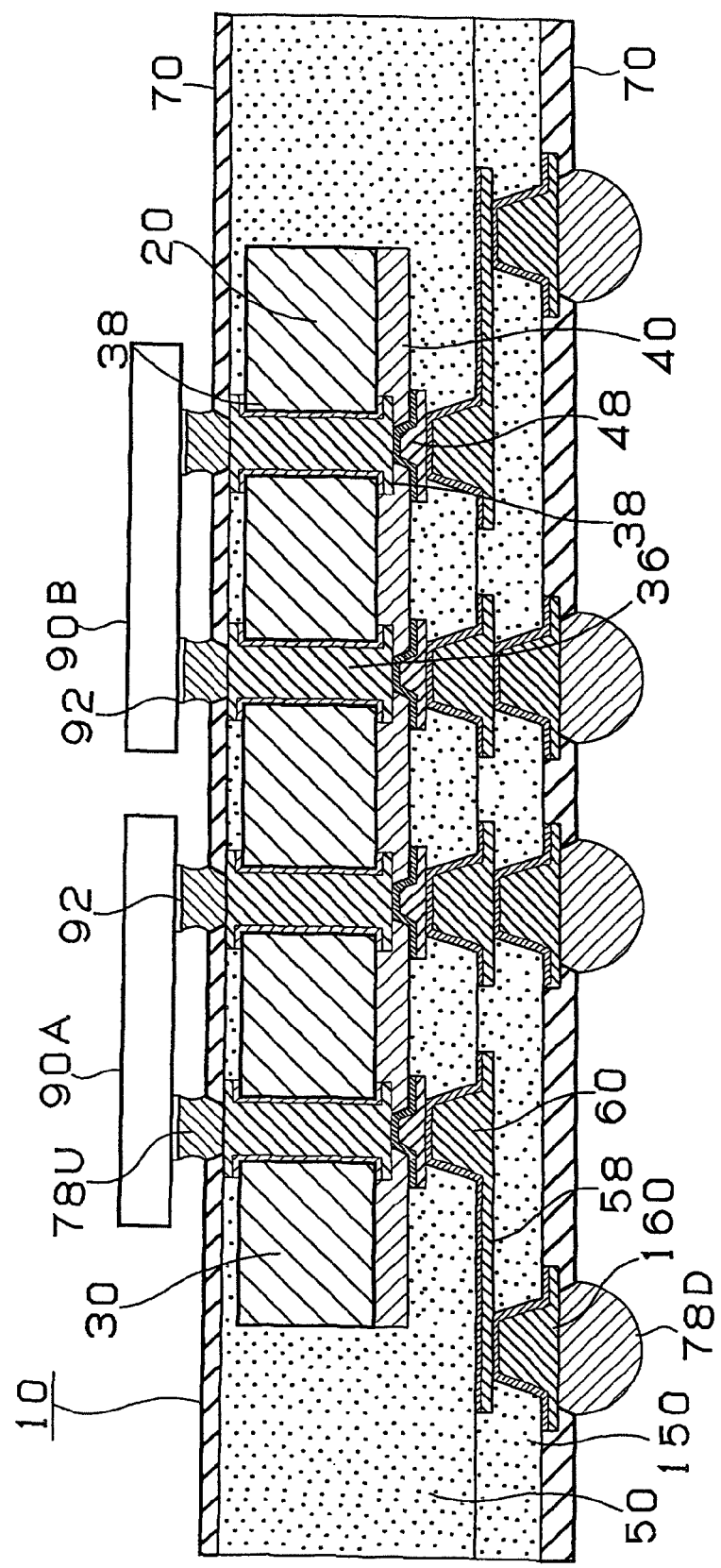
FIG. 10 is a sectional view of the heat resistant substrate incorporated circuit wiring board according to a fourth embodiment of the present invention.

The structure of the heat resistant substrate incorporated circuit wiring board according to the fourth embodiment will be described with reference to FIG. 10. The additional wiring layers are provided on both faces of the core substrate 20 in the first embodiment described with reference to FIG. 1. Contrary to this, according to the fourth embodiment, a built-up wiring layer is provided on the surface (bottom face) on an opposite side to the IC chip (memory) 90A and the IC chip (logic) 90B of the core substrate 20. The structure of the fourth embodiment also can obtain substantially the same effect as the first embodiment.

Fifth Embodiment

Figure 11:
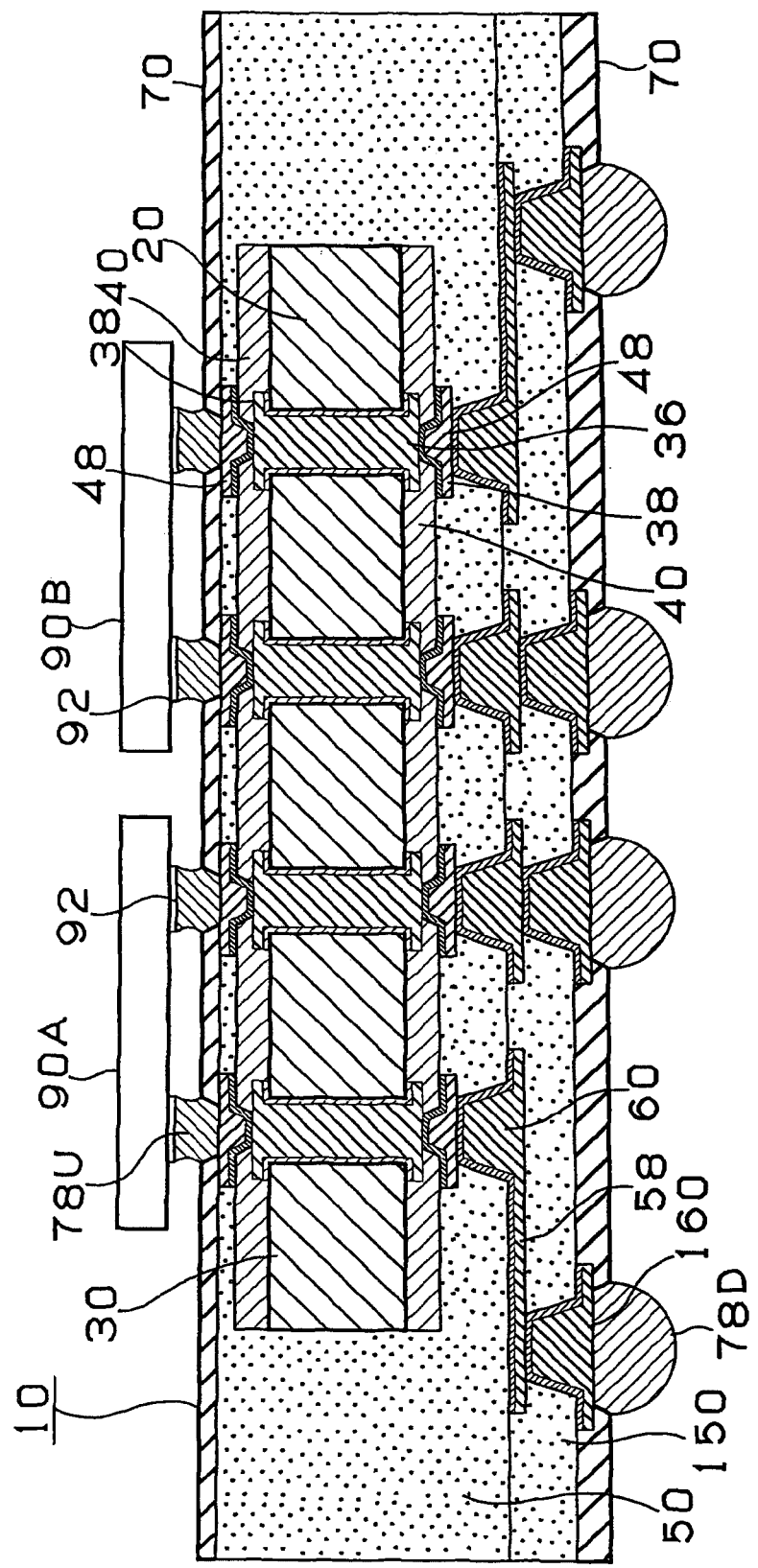
FIG. 11 is a sectional view of the heat resistant substrate incorporated circuit wiring board according to a fifth embodiment of the present invention.

The structure of the heat resistant substrate incorporated circuit wiring board according to the fifth embodiment will be described with reference to FIG. 11. The additional wiring layers are provided on both faces of the core substrate 20 in the first embodiment described with reference to FIG. 1. Contrary to this, according to the fifth embodiment, the built-up wiring layers are provided on both the surface (top face) on the IC chip side of the core substrate 20 and the surface (bottom face) on an opposite side to the IC chip. The structure of the fifth embodiment enables the thermal expansion coefficient of the heat resistant substrate incorporated circuit wiring board to be reduced although the additional wiring with the heat resistant substrate is not performed.

Sixth Embodiment

Figure 12:
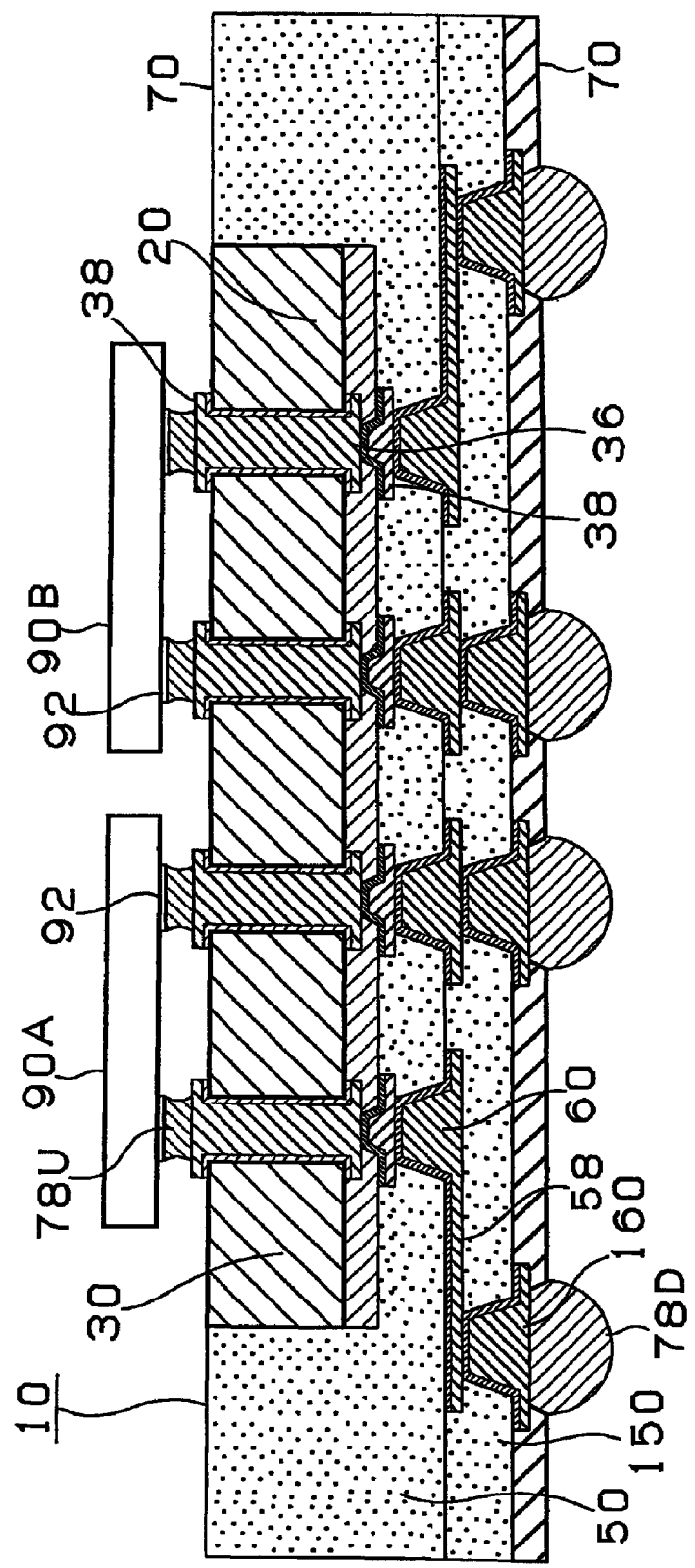
FIG. 12 is a sectional view of the heat resistant substrate incorporated circuit wiring board according to a sixth embodiment of the present invention.

The structure of the heat resistant substrate incorporated circuit wiring board according to the sixth embodiment will be described with reference to FIG. 12. In the first embodiment described with reference to FIG. 1, the heat resistant substrate 30 is incorporated in the interlayer insulation layer 50 of the heat resistant substrate incorporated circuit wiring board 10. Contrary to this, according to the sixth embodiment, while the heat resistant substrate 30 is disposed on the front surface, the interlayer resin insulation layer 50 of the heat resistant substrate incorporated circuit wiring board and the surface on the IC chip side of the heat resistant substrate 30 are formed into a substantially flat surface without a difference of step. Further, no solder resist layer is provided on the top face.

Seventh Embodiment

Figure 13:
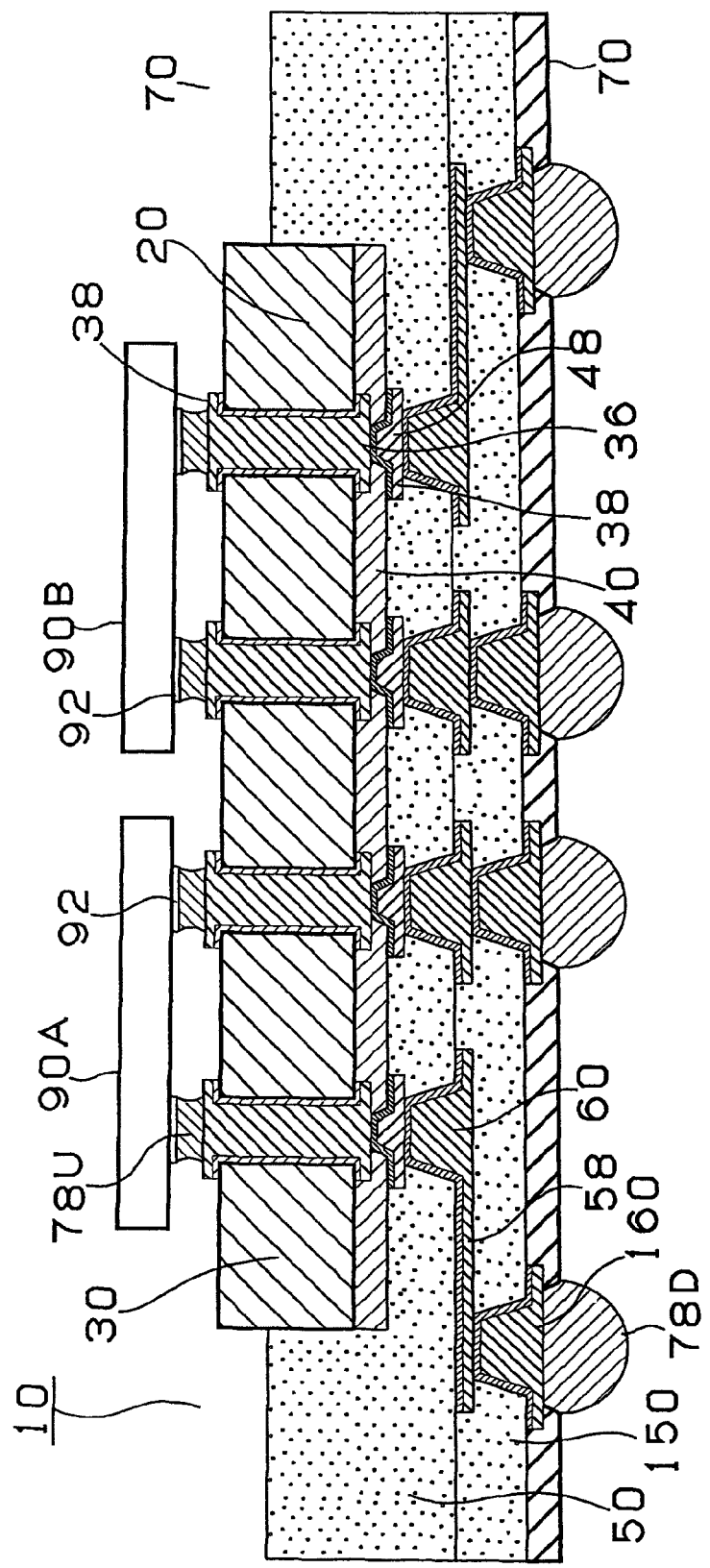
FIG. 13 is a sectional view of the heat resistant substrate incorporated circuit wiring board according to a seventh embodiment of the present invention.

The structure of the heat resistant substrate incorporated circuit wiring board according to the seventh embodiment will be described with reference to FIG. 13. In the first embodiment described with reference to FIG. 1, the heat resistant substrate 30 is incorporated in the interlayer insulation layer 50 of the heat resistant substrate incorporated circuit wiring board 10. Contrary to this, the surface of the heat resistant substrate 30 is projected from the interlayer resin insulation layer 50 on the front surface of the heat resistant substrate incorporated circuit wiring board. Further, no solder resist layer is provided on the top surface.

Eighth Embodiment

Figure 14:
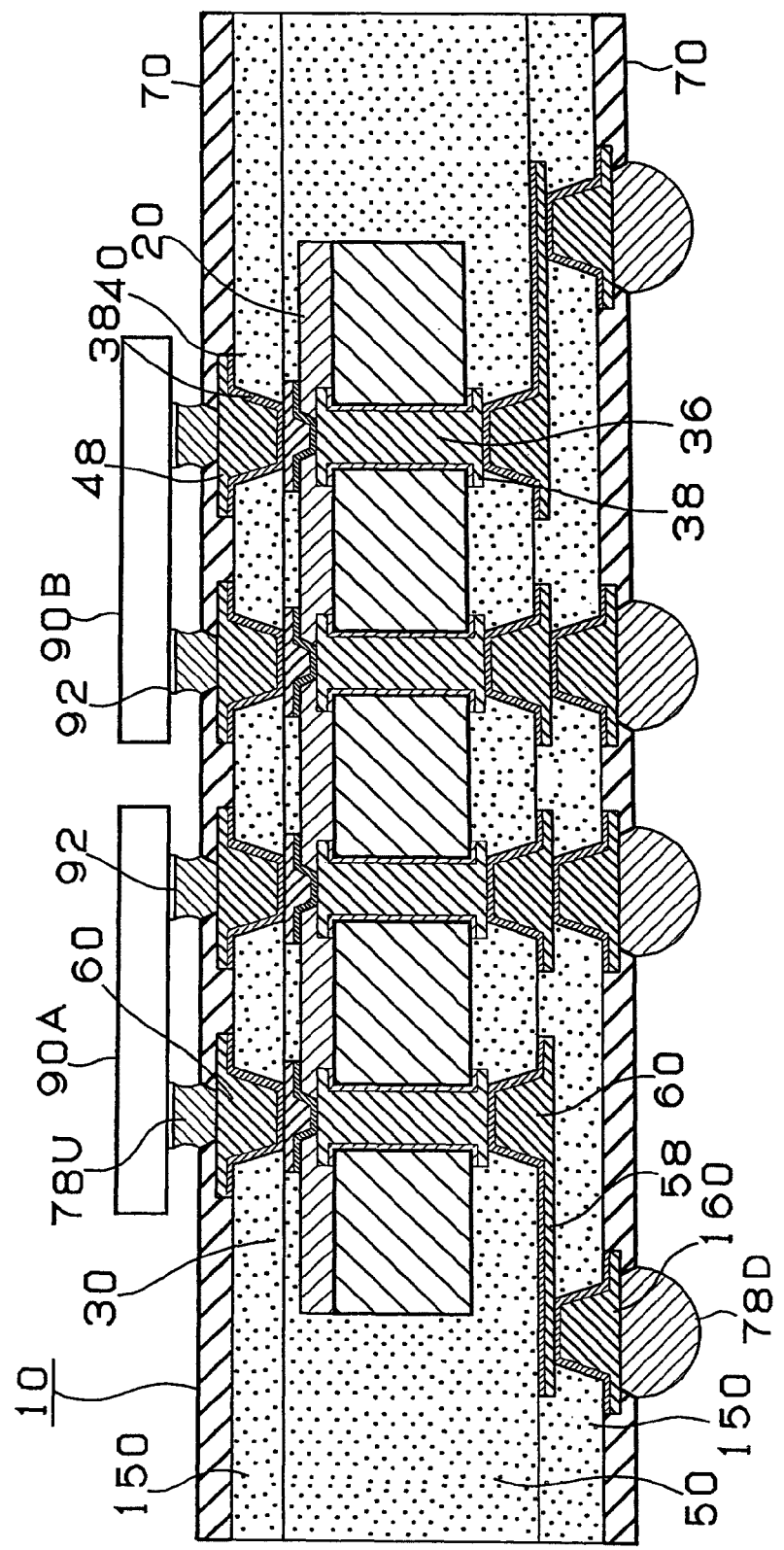
FIG. 14 is a sectional view of the heat resistant substrate incorporated circuit wiring board according to an eighth embodiment of the present invention.

The structure of the heat resistant substrate incorporated circuit wiring board according to the eighth embodiment will be described with reference to FIG. 14. In the first embodiment described with reference to FIG. 1, the built-up layers 50 and 150 of the heat resistant substrate incorporated circuit wiring board are provided on the lower side of the heat resistant substrate 30. Contrary to this, according to the eighth embodiment, the built-up wiring layer 150 of the heat resistant substrate incorporated circuit wiring board is formed on the face on the IC chip side of the heat resistant substrate 30.

Ninth Embodiment

Figure 15:
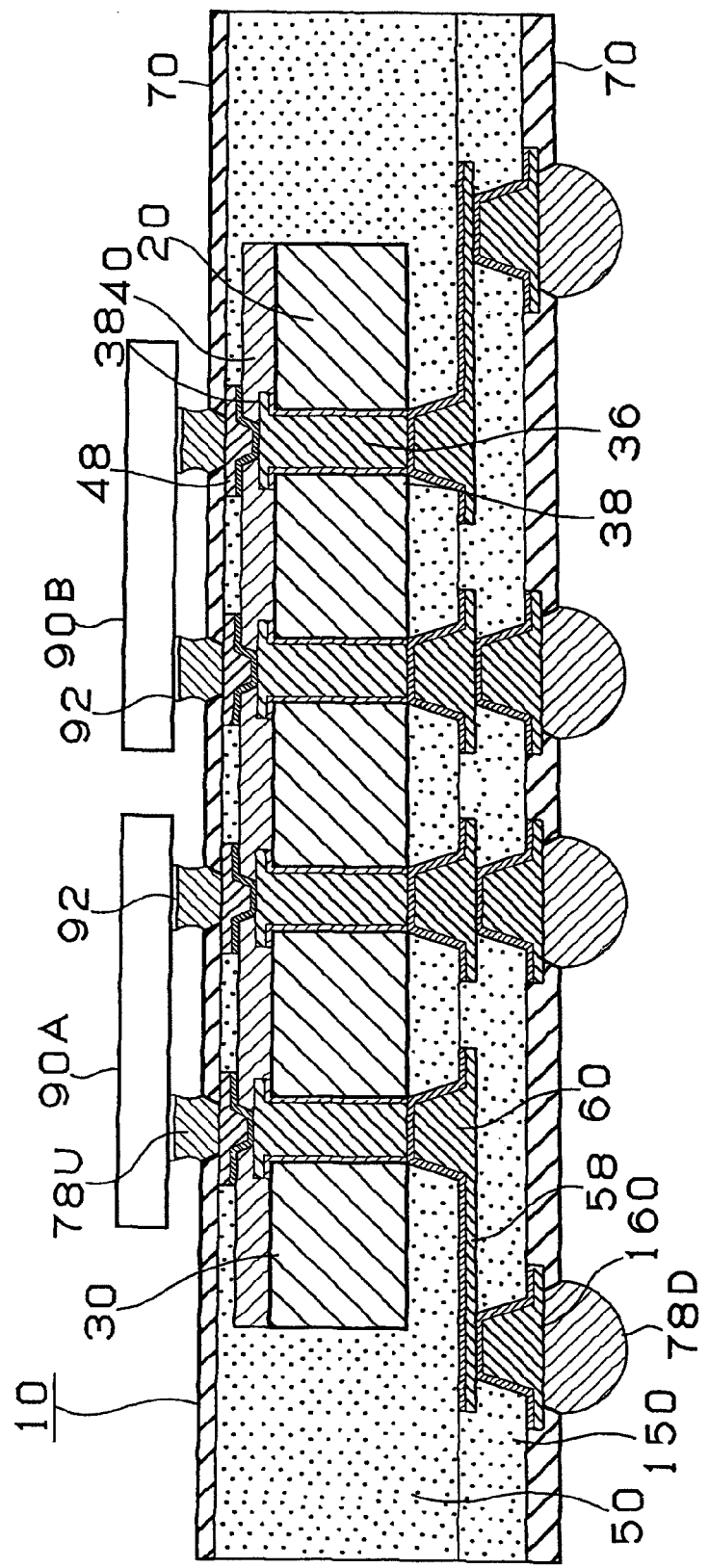
FIG. 15 is a sectional view of the heat resistant substrate incorporated circuit wiring board according to a ninth embodiment of the present invention.

The structure of the heat resistant substrate incorporated circuit wiring board according to the ninth embodiment will be described with reference to FIG. 15. In the first embodiment described with reference to FIG. 1, the through hole pad 38 and the conductor circuit 39 are formed on the surface of the base material 20 of the heat resistant substrate 30. Contrary to this, the through hole pad 38 and the conductor circuit 39 are provided only on the face on the IC chip side of the base material 20 of the heat resistant substrate 30.

Tenth Embodiment

Figure 16:
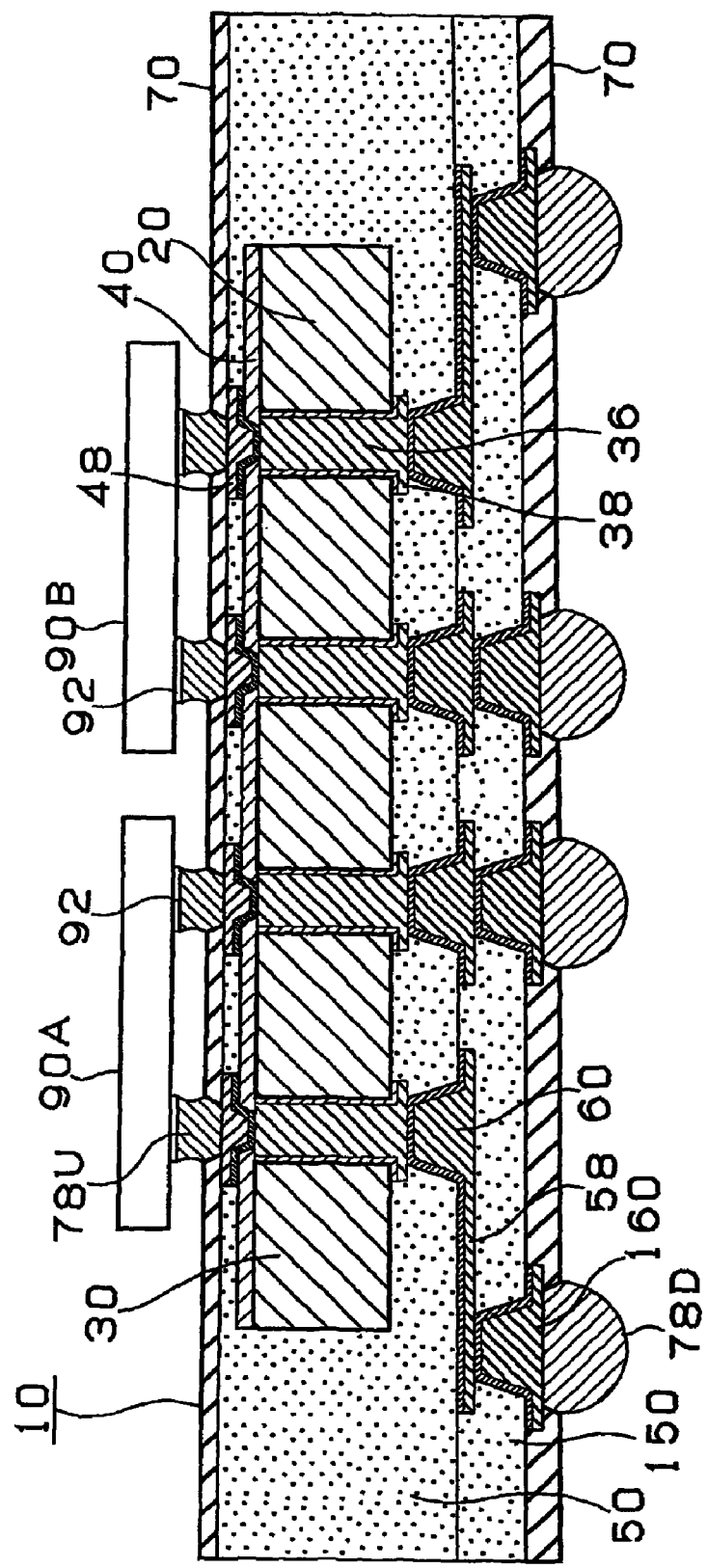
FIG. 16 is a sectional view of the heat resistant substrate incorporated circuit wiring board according to a tenth embodiment of the present invention.

The structure of the heat resistant substrate incorporated circuit wiring board according to the tenth embodiment will be described with reference to FIG. 16. In the first embodiment described with reference to FIG. 1, the through hole pad 38 and the conductor circuit 39 are formed on both faces of the core substrate 20. Contrary to this, according to the tenth embodiment, the through hole pad 38 and the conductor circuit 39 are provided only on the face on an opposite side to the IC chip of the base material 20 of the heat resistant substrate 30.

Eleventh Embodiment

Figure 17:
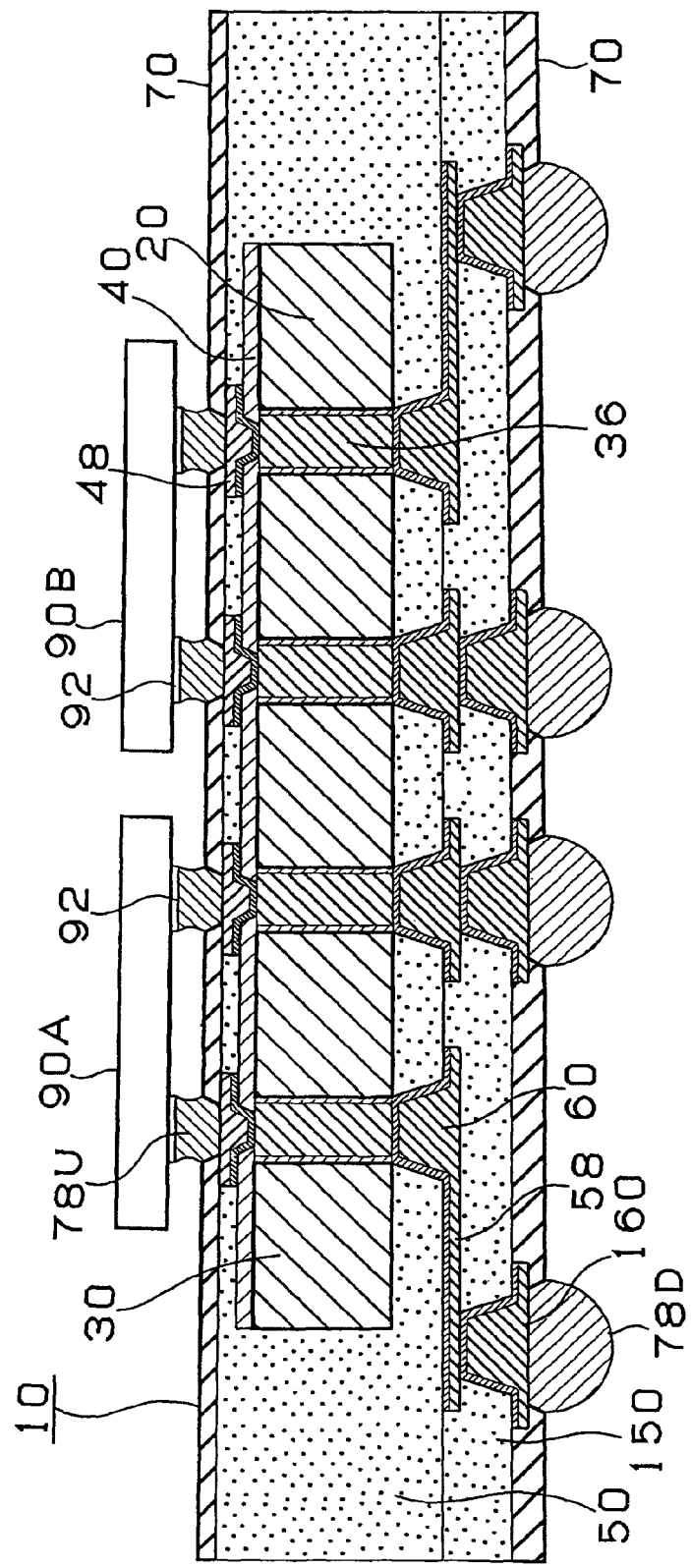
FIG. 17 is a sectional view of the heat resistant substrate incorporated circuit wiring board according to an eleventh embodiment of the present invention.

The structure of the heat resistant substrate incorporated circuit wiring board according to the eleventh embodiment will be described with reference to FIG. 17. In the first embodiment described with reference to FIG. 1, the through hole pad 38 and the conductor circuit 39 are formed on both faces of the core substrate 20. Contrary to this, according to the eleventh embodiment, no conductor circuit is provided on the base material 20.

Although according to the second-fourth, sixth-eleventh embodiments, the pitch of the loading pads 148P, the pitch of the through hole conductors 36 and the pitch of the connecting pads 148D are identical, the present invention is not restricted to this example. The pitch of the loading pads 148P, the pitch of the through hole conductors 36 and the pitch of the connecting pads 148D are preferred to be larger in this order like the first embodiment described with reference to FIG. 1. Although a plurality of electronic components are loaded in the second embodiment-eleventh embodiment, it is permissible to provide an MPU on one side while a memory is provided on the other side and provide both sides of the surface wiring layers (surface built-up layers) on the core substrate 20 with wiring for exchanging a signal therebetween. As other electronic component, chip set, logic, graphic and the like are available.

Although the invention has been disclosed in the context of a certain preferred embodiments, it will be understood that the present invention extends beyond the specifically disclosed embodiments to other alternative embodiments of the invention. Thus, it is intended that the scope of the invention should not be limited by the disclosed embodiments but should be determined by reference to the claims that follow.

What is claimed is:

1. A circuit wiring board comprising:
a wiring substrate; and
a heat resistant substrate accommodated in the wiring substrate and having a thermal expansion coefficient in a range between 3 ppm to 10 ppm and comprising a core substrate and a built-up wiring layer formed over the core substrate, the built-up wiring layer comprising a plurality of conductive layers, a plurality of interlayer resin insulating layers and a via hole conductor connecting the conductive layers through one of the interlayer resin insulating layers,
wherein the core substrate has a first surface and a second surface on an opposite side of the first surface, the built-up layer is formed over the first surface, and the core substrate has a through hole conductor electrically connecting the built-up layer to the second surface of the core substrate, the heat resistant substrate further comprises a plurality of loading pads positioned to be connected to an electrode of an electronic component on a surface of the built-up wiring board, the through hole conductor is formed in a plurality at a pitch, and the loading pads are positioned a pitch which is smaller than the pitch of the through hole conductors of the core substrate.

2. The circuit wiring board according to claim 1, wherein the through hole conductor is formed in a plurality at a pitch of between 30 μm to 200 μm.

3. The circuit wiring board according to claim 1, further comprising a second built-up layer formed over the second surface of the core substrate and a wiring substrate formed over the second built-up layer, wherein the heat resistant substrate further comprises a plurality of connecting pads positioned to be connected electrically to the wiring substrate, and the connecting pads are positioned at a pitch which is larger than the pitch of the through hole conductors of the core substrate.

4. The circuit wiring board according to claim 1, further comprising a second built-up wiring layer formed on the second surface of the core substrate, the heat resistant substrate further comprises a plurality of connecting pads for connecting electrically an electrode of a second electronic component formed on a surface of the second built-up layer, and the pitch of the loading pads, the pitch of the through hole conductors, and a pitch of the connecting pads are increased in an order of the loading pads, the through hole conductors and the connecting pads.

5. The circuit wiring board according to claim 1, further comprising a solder resist layer provided on the built-up layer.

6. The circuit wiring board according to claim 1, further comprising a second built-up layer formed over the second surface of the core substrate and a wiring substrate formed over the second built-up layer, wherein the heat resistant substrate and the wiring substrate form a surface substantially flat with each other.

7. The circuit wiring board according to claim 1, wherein the plurality of through hole conductors comprises a plurality of plated conductors formed inside a plurality of holes formed through the core substrate, respectively.

8. The circuit wiring board according to claim 1, wherein the via hole conductor is formed in a plurality, the plurality of via hole conductors, and the built-up layer further comprises a plurality of connections formed on the plurality of via hole conductors and positioned to be connected to another wiring board.

9. The circuit wiring board according to claim 1, wherein the core substrate has a thermal expansion coefficient which is lower than a thermal expansion coefficient of the interlayer resin insulating layers.

10. The circuit wiring board according to claim 1, wherein the core substrate comprises a single board.

* * * * *